United States Patent
Wang et al.

(10) Patent No.: US 11,862,407 B2
(45) Date of Patent: Jan. 2, 2024

(54) PREPARATION METHOD FOR PEROVSKITE FILM, AND RELATED PEROVSKITE FILM AND SOLAR CELL

(71) Applicant: CONTEMPORARY AMPEREX TECHNOLOGY CO., LIMITED, Ningde (CN)

(72) Inventors: Yandong Wang, Ningde (CN); Zhaohui Liu, Ningde (CN); Shuojian Su, Ningde (CN); Yongsheng Guo, Ningde (CN); Guodong Chen, Ningde (CN); Chuying Ouyang, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 17/994,455

(22) Filed: Nov. 28, 2022

(65) Prior Publication Data
US 2023/0170156 A1    Jun. 1, 2023

Related U.S. Application Data

(63) Continuation of application No. PCT/CN2021/132097, filed on Nov. 22, 2021.

(51) Int. Cl.
| | | |
|---|---|---|
| *H10K 71/16* | (2023.01) | |
| *H01G 9/20* | (2006.01) | |
| *H01G 9/00* | (2006.01) | |
| *H10K 30/30* | (2023.01) | |
| *H10K 30/40* | (2023.01) | |

(Continued)

(52) U.S. Cl.
CPC ........... *H01G 9/2009* (2013.01); *C23C 14/06* (2013.01); *C23C 14/0694* (2013.01);
(Continued)

(58) Field of Classification Search
CPC .. H01G 9/2009; H01G 9/0029; H01G 9/0036; H10K 30/40; H10K 30/82;
(Continued)

(56) References Cited

FOREIGN PATENT DOCUMENTS

| CN | 104250723 A | 12/2014 |
|---|---|---|
| CN | 105914296 A | 8/2016 |

(Continued)

OTHER PUBLICATIONS

International Search Report and Written Opinion dated Aug. 17, 2022, received for PCT Application PCT/CN2021/132097, filed on Nov. 22, 2021, 15 pages including English Translation.

(Continued)

*Primary Examiner* — Rodney G McDonald
(74) *Attorney, Agent, or Firm* — XSENSUS LLP

(57) ABSTRACT

The present application provides a method for preparing a perovskite film, and a related perovskite film, solar cell and solar cell device thereof. The preparation method may include the steps of (1) providing a target material comprising the following elements: lead, a halogen, and one or more alkali metals; (2) sputtering using the target material in step (1), where a process gas is a noble gas, optionally, argon, so as to obtain a film; (3) subjecting the film obtained in step (2) to a chemical bath treatment, wherein the chemical bath is a solution of AX, A is selected from one or more of formamidine or methylamine, and X is a halogen; and (4) sputtering on the film obtained in step (3) using a tin metal, where a process gas comprises a noble gas, optionally, a mixture of argon and a halogen gas, so as to obtain the perovskite film.

8 Claims, 1 Drawing Sheet

(51) Int. Cl.
 *H10K 30/82* (2023.01)
 *C23C 14/58* (2006.01)
 *C23C 14/06* (2006.01)
 *H10K 85/30* (2023.01)

(52) U.S. Cl.
 CPC ........ *C23C 14/584* (2013.01); *C23C 14/5846* (2013.01); *H01G 9/0029* (2013.01); *H01G 9/0036* (2013.01); *H10K 30/30* (2023.02); *H10K 30/40* (2023.02); *H10K 30/82* (2023.02); *H10K 71/164* (2023.02); *H10K 85/30* (2023.02)

(58) Field of Classification Search
 CPC .... H10K 71/164; H10K 85/30; Y02E 10/549; C23C 14/584; C23C 14/5846; C23C 14/06; C23C 14/0694
 USPC .......................... 204/192.12–192.26
 See application file for complete search history.

(56) References Cited

FOREIGN PATENT DOCUMENTS

| | | |
|---|---|---|
| CN | 109411554 A | 3/2019 |
| CN | 113241411 A | 8/2021 |
| WO | 2021/025519 A1 | 2/2021 |

OTHER PUBLICATIONS

Da Silva Filho et al., "Perovskite Thin Film Synthesised from Sputtered Lead Sulphide", Scientific Reports, vol. 8, No. 1563, Jan. 24, 2018, pp. 1-8.

PREPARATION METHOD FOR PEROVSKITE FILM, AND RELATED PEROVSKITE FILM AND SOLAR CELL

CROSS-REFERENCE TO RELATED APPLICATION

The present application is a continuation of International Application No. PCT/CN2021/132097, filed Nov. 22, 2021, which is incorporated herein by reference in its entirety.

TECHNICAL FIELD

The present application relates to the technical field of solar cells, and in particular relates to a method for preparing a perovskite film, and a related perovskite film, solar cell, and solar cell device thereof.

BACKGROUND ART

The perovskite film solar cell has gradually become a hot topic of research for a new generation of solar cell due to its advantages of a low electron-hole pair recombination rate, a wide range of strong optical absorption, etc. The existing methods for preparing a perovskite film mainly include a solution-chemical method, a spin coating process, and a vapor deposition process. Among these methods, the solution-chemical method has a low preparation cost and a relatively simple processes, and is a predominant method for preparing high-quality films in the laboratory; however, this method has poor process stability and reproducibility, and is not conducive to large-scale production. The spin coating process is a primary method for making large-area perovskite films but has a single film formation, is greatly affected by the solution material, and cannot be flexibly controlled, with the uniformity of the coated film being also difficult to ensure. The vapor deposition process in the prior art has high requirements for equipment and it is not easy to control the relative proportion of the precursors, which greatly increases the difficulty in preparing high-quality film layers and results in severe waste of raw materials at the same time. Therefore, it is very meaningful to provide a novel perovskite film preparation method with an excellent film formation quality and good process controllability.

SUMMARY OF THE DISCLOSURE

In view of the above issues, the present application is made with one of objectives to provide a method for preparing a perovskite film; the method enables a perovskite film with uniform film formation, the various process parameters thereof are flexibly controllable, and by adjusting the preparation parameters, the perovskite films can be adapted to different solar cell systems.

In order to achieve the above objective, some embodiments of the present application provide a method for preparing a perovskite film, and a related perovskite film, solar cell and solar cell device thereof.

In a first aspect, the present application provides a method for preparing a perovskite film, including the steps of
(1) providing a target material comprising the following elements: lead, a halogen, and one or more alkali metals;
(2) sputtering using the target material in step (1), where a process gas is a noble gas, optionally, argon, so as to obtain a film;
(3) subjecting the film obtained in step (2) to a chemical bath treatment, wherein the chemical bath is a solution of AX, A is selected from one or more of formamidine or methylamine, and X is a halogen; and
(4) sputtering on the film obtained in step (3) using a tin metal, where a process gas is a noble gas, optionally, a mixture of argon and a halogen gas, so as to obtain the perovskite film.

The method of the present application allows various parameters to be adjusted in a wide range, and has significantly improved process stability and controllability compared with the prior art.

In one embodiment, optionally, the target material in step (1) comprises 10-40% of an alkali metal, 10-40% of lead and 50-90% of halogen, with a total of 100%, based on the total moles of various elements in the target material. When the molar contents of the various elements are within the above range, the corresponding solar cell will have a higher conversion efficiency.

In one embodiment, optionally, in step (1), the halogen is one or more of chlorine, bromine or iodine, and the alkali metal is one or more of potassium, rubidium or cesium.

In one embodiment, optionally, the solution of AX in step (3) has a concentration of mg/ml, optionally 20-70 mg/ml. Thus, the film formation uniformity of the perovskite film can be further improved, such that the conversion efficiency of the corresponding cell is improved.

In one embodiment, optionally, the chemical bath treatment in step (3) is carried out at a temperature of 40° C.-120° C., optionally 50° C.-80° C. Thus, the properties of the resulting perovskite film can be further improved, such that the conversion efficiency of the corresponding cell is improved.

In one embodiment, optionally, in the step (4), the volume ratio of the noble gas, optionally argon, to a halogen gas is 10:1 to 5:1. The use of a mixture of a noble gas and a halogen gas as the process gas can further improve the properties of the resulting perovskite film, such that the conversion efficiency of the corresponding cell is improved.

In one embodiment, optionally, the halogen gas in step (4) includes one or more of iodine vapor, bromine vapor or chlorine vapor.

In one embodiment, optionally, the step (4) is carried out at a temperature of 50° C.-250° C., optionally 100° C.-200° C.

In a second aspect, the present application provides a perovskite film, which can be prepared by the method of the first aspect of the present application.

In one embodiment, optionally, the perovskite film has a thickness of 200-500 nm, optionally 400-500 nm, more optionally 450-470 nm.

In one embodiment, optionally, the perovskite film has a perovskite layer band gap of 1.2-1.6 eV, optionally 1.4-1.5 eV.

In a third aspect, the present application provides a solar cell comprising the following components provided successively from bottom to top:
a transparent conductive electrode;
a hole transport layer;
a perovskite layer;
an electron transport layer; and
a back electrode;
wherein the hole transport layer and the electron transport layer may be positioned interchangeably, and the perovskite layer is a perovskite film prepared by the method of the first aspect of the present application or the perovskite film of the second aspect of the present application.

In one embodiment, optionally, the transparent conductive electrode is selected from one or more of indium tin oxide, or fluorine-doped tin dioxide.

In one embodiment, optionally, the hole transport layer is selected from one or more of poly(3,4-ethylenedioxythiophene):poly(styrenesulfonate) (PEDOT:PSS), polytriarylamine (PTAA), CuSCN, $NiO_x$, CuI, or $MoO_x$.

In one embodiment, optionally, the electron transport layer is selected from one or more of 2,2',7,7'-tetrakis[N,N-di(4-methoxyphenyl)amino]-9,9'-spirobifluorene (spiro-OMeTAD), $WO_3$, polyethyleneimine ethoxylated (PETE), polyethyleneimine (PEI), ZnO, $TiO_2$, [6,6]-phenyl-C61-butyric acid isomethyl ester (PCBM), $SnO_2$, or fluorine-doped $SnO_2$.

In one embodiment, optionally, the back electrode is selected from one or more of indium tin oxide, tungsten-doped indium oxide, aluminum-doped zinc oxide (AZO), Au, Ag, Cu, Al, Ni, Cr, Bi, Pt, or Mg.

In a fourth aspect, the present application provides a solar cell device, comprising a solar cell of the third aspect of the present application.

The solar cell and the solar cell device of the present application comprise the perovskite film prepared by the method of the present application, and therefore have the same advantages as those of the preparation method of the present application.

BRIEF DESCRIPTION OF THE DRAWINGS

FIG. 1 is a schematic diagram of a solar cell according to an embodiment of the present application.

LIST OF REFERENCE NUMERALS

1—back electrode; 2—hole transport layer; 3—perovskite layer; 4—electron transport layer; 5—transparent conductive electrode; 6—glass

DETAILED DESCRIPTION OF EMBODIMENTS

Hereafter, embodiments of a method for preparing a perovskite film, and a related perovskite film, solar cell and solar cell device of the present application are specifically disclosed in the detailed description with reference to the accompanying drawings as appropriate. However, unnecessary detailed illustrations may be omitted in some instances. For example, there are situations where detailed description of well known items and repeated description of actually identical structures are omitted. This is to prevent the following description from being unnecessarily verbose, and facilitates understanding by those skilled in the art. Moreover, the accompanying drawings and the descriptions below are provided for enabling those skilled in the art to fully understand the present application, rather than limiting the subject matter disclosed in claims.

"Ranges" disclosed in the present application are defined in the form of lower and upper limits, and a given range is defined by selection of a lower limit and an upper limit, the selected lower and upper limits defining the boundaries of the particular range. Ranges defined in this manner may be inclusive or exclusive, and may be arbitrarily combined, that is, any lower limit may be combined with any upper limit to form a range. For example, if the ranges of 60-120 and 80-110 are listed for a particular parameter, it should be understood that the ranges of 60-110 and 80-120 are also contemplated. Additionally, if minimum range values 1 and 2 are listed, and maximum range values 3, 4, and 5 are listed, the following ranges are all contemplated: 1-3, 1-4, 1-5, 2-3, 2-4, and 2-5. In the present application, unless stated otherwise, the numerical range "a-b" denotes an abbreviated representation of any combination of real numbers between a and b, where both a and b are real numbers. For example, the numerical range "0-5" means that all real numbers between "0-5" have been listed herein, and "0-5" is just an abbreviated representation of combinations of these numerical values. In addition, when a parameter is expressed as an integer of ≥2, it is equivalent to disclosing that the parameter is, for example, an integer of 2, 3, 4, 5, 6, 7, 8, 9, 10, 11, 12, and the like.

All the implementations and optional implementations of the present application can be combined with one another to form new technical solutions, unless otherwise stated.

All technical features and optional technical features of the present application can be combined with one another to form a new technical solution, unless otherwise stated.

Unless otherwise stated, all the steps of the present application can be performed sequentially or randomly, preferably sequentially. For example, the method including steps (a) and (b) indicates that the method may include steps (a) and (b) performed sequentially, and may also include steps (b) and (a) performed sequentially. For example, reference to "the method may further include step (c)" indicates that step (c) may be added to the method in any order, e.g., the method may include steps (a), (b) and (c), steps (a), (c) and (b), and also steps (c), (a) and (b), etc.

The terms "comprise" and "include" mentioned in the present application are open-ended or closed-ended, unless otherwise stated. For example, "comprise" and "include" may mean that other components not listed may further be comprised or included, or only the listed components may be comprised or included.

The term "not less than" and "not more than" used in the present application includes the number itself. For example, "not less than one" means one or more, and "at least one of A and B" means "A", "B" or "A and B".

In the present application, the term "or" is inclusive unless otherwise specified. For example, the phrase "A or B" means "A, B, or both A and B". More specifically, a condition "A or B" is satisfied by any one of the following: A is true (or present) and B is false (or not present); A is false (or not present) and B is true (or present); or both A and B are true (or present).

The inventors of the present application have found in practical operations that: in a solar cell using a perovskite film, in order to improve the conversion efficiency of the solar cell, different solar cells require perovskite films with different parameters, such as a band gap width. However, the preparation methods for the perovskite film in the prior art are of poor controllability in term of process conditions, and difficult to meet the needs of different working conditions. In the actual production, this deficiency, for one thing, results in the increase of the preparation costs of the perovskite films, and for another, may cause the resulting product to be poor in quality, which in turn leads to a solar cell with low conversion efficiency. For example, the solution-chemical method for preparing the perovskite films not only involves the use of a toxic solvent, but is difficult to control the formation uniformity of large-area films, which greatly limits the actual application of the perovskite solar cell in the industry.

After a lot of research, the inventors have found a novel method for preparing the perovskite film, and the preparation method has significantly improved process stability and controllability compared to the prior art. In addition, the inventors further improve the processing steps and corresponding process parameters, which significantly enhances the uniformity of the obtained film layer and improves the properties of the film layer, such that the solar cell comprising the resulting film layer has a higher conversion efficiency.

[Preparation Method for Perovskite Film]

In a first aspect, the present application provides a method for preparing a perovskite film, including the steps of
(1) providing a target material comprising the following elements: lead, a halogen, and one or more alkali metals;
(2) sputtering using the target material in step (1), where a process gas is a noble gas, optionally, argon, so as to obtain a film;
(3) subjecting the film obtained in step (2) to a chemical bath treatment, wherein the chemical bath is a solution of AX, A is selected from one or more of formamidine or methylamine, and X is a halogen; and
(4) sputtering on the film obtained in step (3) using a tin metal, where a process gas is a noble gas, optionally, a mixture of argon and a halogen gas, so as to obtain the perovskite film.

The above preparation method for the perovskite film combines different processing steps flexibly, and thus allows various process parameters to be adjusted in a relatively wide range, such that the process stability and controllability are significantly improved compared to the prior art.

In addition, the inventors have found in the further research that, the adjustment of various process parameters of the preparation method can further enhance the uniformity of the obtained film and improve the quality of the film formation, such that the solar cell comprising the resulting film layer has a higher conversion efficiency.

In some embodiments, optionally, the target material in step (1) comprises 10-40% of an alkali metal, 10-40% of lead and 50-90% of halogen, with a total of 100%, based on the total moles of various elements in the target material.

Although the mechanism is still unclear, the inventors have found in the research that when the contents of the elements, especially the alkali metal and lead, are within the above ranges, the perovskite film prepared by the method of the present application with the target material has more uniform film formation, and the finally manufactured solar cell has a higher conversion efficiency.

In some embodiments, optionally, in step (1), the halogen is one or more of chlorine, bromine or iodine, and the alkali metal is one or more of potassium, rubidium or cesium.

In the present application, a preliminary sputtering is performed in step (2) to obtain a film layer. It should be noted that the present application has no special requirement for the equipment for the sputtering step, and any equipment commonly used in the art can be used. For example, step (2) may be performed in magnetron sputtering equipment. In addition, for the sputtering using the target, some kind of substrates may be used generally, and the film formed on the surface of the substrate is the film described in step (2) of the present application. Herein, the selection of the substrate is not particularly limited. For example, the substrate may be a substrate commonly used in the art, such as a ceramic, a glass, tin dioxide, doped tin dioxide, etc.

In the method of the present application, the temperature for step (2) is not specially required, for example, the step may be performed at room temperature. However, a person skilled in the art understands that, the temperature should not be too low to avoid a too low sputtering rate.

In some embodiments, optionally, a noble gas, optionally argon, is used in step (2) as the process gas. The presence of the process gas is beneficial for improving the uniformity of the resulting perovskite film.

In some embodiments, optionally, the flow rate of the process gas in (2) is 100-500 sccm, optionally, 150-300 sccm.

In some embodiments, optionally, when step (2) is performed in magnetron sputtering equipment, the corresponding power of the magnetron sputtering equipment is 100 W-20 kW, optionally, 500 w-5 kw.

In some embodiments, optionally, step (2) is performed with a chamber pressure in the equipment of 0-200 Pa, excluding 0 Pa.

In some embodiments, optionally, the sputtering thickness in step (2) is 10-300 nm.

In the method of the present application, the film layer obtained in step (2) is subjected to a chemical bath treatment, which can introduce organic ions, for example, methylamine ions ($CH_3NH_3^+$, $MA^+$) or formamidine ions ($FA^+$), into the film layer, so as to improve the quality of the film layer, such that the conversion efficiency of the corresponding solar cell is further improved.

In some embodiments, optionally, the solution of AX in step (3) has a concentration of 10-100 mg/ml, optionally, 20-70 mg/ml.

When the concentration of the solution of AX is lower than the above ranges, the performance of the film layer is not obviously improved by the chemical bath treatment, and the conversion efficiency of the corresponding solar cell is relatively low. When the concentration of the solution of AX is too high, this may lead to the introduction of too many methylamine ions or formamidine ions, which will damage the quality of the film layer. Optionally, when the concentration of the solution of AX is 10-100 mg/ml, optionally, 20-70 mg/ml, the improvement in film layer quality is better.

In some embodiments, optionally, the solvent in the solution of AX is a solvent commonly used in the art, for example, one or more of an aromatic compound, such as xylene, toluene, or alkylnaphthalene; a chlorinated aromatic hydrocarbon or a chlorinated aliphatic hydrocarbon, such as chlorobenzene, vinyl chloride, or dichloromethane; an alcohol, such as butanol, iso-propyl alcohol, or ethylene glycol; and an ether or an ester; a ketone, such as acetone, methyl ethyl ketone, methyl iso-butyl ketone or cyclohexanone; a strong polar solvent, such as dimethylformamide and dimethyl sulfoxide, as well as water. Optionally, the solvent is one or more of iso-propyl alcohol or chlorobenzene.

In some embodiments, optionally, the chemical bath treatment in step (3) is carried out at a temperature of 40° C.-120° C., optionally 50° C.-80° C.

A suitable temperature for the chemical bath treatment is beneficial for accelerating the permeation and migration of the doped ions towards the film layer, so as to improve the quality of the film layer. When the temperature for the chemical bath treatment is too low, for example, lower than room temperature, the chemical bath treatment is performed slowly.

When the chemical bath treatment is carried out at a temperature higher than 150° C., it may deteriorate the film layer, worsen the properties of the film layer, and then result in a significantly reduction in conversion efficiency of the solar cell.

The method of the present application further includes a step (4) of post-treating the film layer obtained by the chemical bath treatment. Different from step (2), the sputtering treatment in step (4), for one thing, can improve the film layer in term of the quality defects thereof caused by, for example, possible inappropriate operations in the preceding processing steps, and for another, can introduce metal tin, halogens, etc., to further improve the quality of the film layer, such that the prepared perovskite film can have an uniform film formation thickness, an excellent film quality, so as to improve the conversion efficiency of the corresponding solar cell.

In some embodiments, optionally, in the step (4), the volume ratio of the noble gas, optionally argon, to a halogen gas is 10:1 to 5:1.

In the present application, the noble gas, optionally argon, for one thing, functions for protection to avoid damage to equipment or safety accidents due to high temperature, and for another, it can be used to generate ions by bombardment, for example, the bombardment of the target material or the halogen gas, so as to dope the film layer to improve the quality of the film layer. Optionally, in the present application, in a case where the total amount of the mixed gas of the noble gas (optionally, argon) and the halogen gas remains the same, the adjustment of the volume ratio of the two gases is beneficial for improving the quality of the film layer. In particular, when the volume ratio of the noble gas, optionally argon, to a halogen gas is 10:1 to 5:1, the quality of the film layer is more significantly improved.

In some embodiments, optionally, the halogen gas in step (4) includes one or more of iodine vapor, bromine vapor or chlorine vapor.

In some embodiments, optionally, the halogen gas in step (4) is a mixture of bromine vapor and iodine vapor, where the bromine vapor and the iodine vapor are in a volume ratio of 1:3 to 3:1.

In some embodiments, optionally, the flow rate of the process gas in step (4) is 100-500 sccm, optionally, 150-300 sccm.

In some embodiments, optionally, step (4) is carried out at a temperature of 50° C.-250° C., optionally 100° C.-200° C.

When step (4) is carried out within the above temperature ranges, for one thing, the corresponding sputtering reaction rate is relatively fast, which is beneficial for improving the equipment efficiency, and for another, a high temperature facilitates to accelerate the ion migration, thus accelerating the annealing treatment to the overall film layer. In addition, suitable operation temperature also helps to avoid coagulation and the deterioration of the film layer performance, so as to avoid worsening the conversion efficiency of the solar cell.

In some embodiments, optionally, when step (4) is performed in magnetron sputtering equipment, the corresponding power of the magnetron sputtering equipment is 600 W-5 kW.

In some embodiments, optionally, the step (4) is performed with a chamber pressure in the equipment is 0-200 Pa, excluding 0 Pa.

In some embodiments, optionally, the sputtering thickness in step (4) is 120-200 nm, optionally, 150-170 nm.

[Perovskite Film]

In a second aspect, the present application provides a perovskite film, which can be prepared by the method of the first aspect of the present application.

In some embodiments, optionally, the perovskite film has a thickness of 200-500 nm, optionally 400-500 nm, more optionally 450-470 nm.

It should be noted that, in the present application, "the thickness of the perovskite film" refers to the corresponding thickness of the film obtained after all steps (1)-(4) are performed.

In some embodiments, optionally, the perovskite film has a perovskite layer band gap of 1.2-1.6 eV, optionally 1.4-1.5 eV.

[Solar Cell]

In a third aspect, the present application provides a solar cell comprising the following components provided successively from bottom to top:
  a transparent conductive electrode;
  a hole transport layer;
  a perovskite layer;
  an electron transport layer; and
  a back electrode;
  wherein the hole transport layer and the electron transport layer may be positioned interchangeably, and the perovskite layer is a perovskite film prepared by the method of the first aspect of the present application or the perovskite film of the second aspect of the present application.

In some embodiments, optionally, the transparent conductive electrode is selected from one or more of indium tin oxide, or fluorine-doped tin dioxide.

In some embodiments, optionally, the hole transport layer is selected from one or more of poly(3,4-ethylenedioxythiophene):poly(styrenesulfonate) (PEDOT:PSS), polytriarylamine (PTAA), CuSCN, $NiO_x$, CuT, or $MoO_x$.

In some embodiments, optionally, the electron transport layer is selected from one or more of 2,2',7,7'-tetrakis[N,N-di(4-methoxyphenyl)amino]-9,9'-spirobifluorene (spiro-OMeTAD), $WO_3$, polyethyleneimine ethoxylated (PETE), polyethyleneimine (PEI), ZnO, $TiO_2$, [6,6]-phenyl-C61-butyric acid isomethyl ester (PCBM), $SnO_2$, or fluorine-doped $SnO_2$.

In some embodiments, optionally, the back electrode is selected from one or more of indium tin oxide, tungsten-doped indium oxide, aluminum-doped zinc oxide (AZO), Au, Ag, Cu, Al, Ni, Cr, Bi, Pt, or Mg.

In some embodiments, optionally, the solar cell of the present application can be prepared by a method commonly used in the art. For example, the transparent conductive electrode, the hole transport layer, the perovskite layer, the electron transport layer, and the back electrode layer may be successively stacked, wound and pressed, wherein the hole transport layer and the electron transport layer may be positioned interchangeably.

[Solar Cell Device]

Perovskite films are widely used in the field of functional materials, especially in optoelectronics. As an example, the present application studies the use of the perovskite film prepared by the method of the present application in the field of solar cells. It should be understood that, the example provided by the present application is merely for explaining the use of the perovskite film prepared by the method of the present application, and a person skilled in the art would understand that the use of the perovskite film is not limited to the exemplary use as provided.

In a fourth aspect, the present application provides a solar cell device, comprising one or more of the perovskite films prepared by the method of the first aspect of the present application, the perovskite film of the second aspect of the present application, or the solar cell of the third aspect of the present application.

EXAMPLES

Hereinafter, the examples of the present application will be explained. The examples described below are exemplary and are merely for explaining the present application, and should not be construed as limiting the present application. The techniques or conditions that are not specified in examples are according to the techniques or conditions described in documents in the art or the product introduction. The reagents or instruments used, if they are not marked with the manufacturer, are common products that are commercially available.

The sources of the raw materials used in examples are shown in the table as below:

| Name | Chemical formula | Manufacturer | Specification |
|---|---|---|---|
| Fluorine-doped tin dioxide (FTO) | — | Huaian Yaoke Optoelectronic Co., Ltd. | A fluorine doping amount of 10%, based on the weight of the tin dioxide |
| C60 | Fullerene C60 | Xi'an Polymer Light Technology Corp. | |
| BCP powder | 2,9-dimethyl-4,7-biphenyl-1,10-phenanthroline | Xi'an Polymer Light Technology Corp. | |
| Target material 1 | Cesium lead halide | ZhongNuo Advanced Material (Beijing) Technology Co., Ltd. | 10 mol % of cesium, 30 mol % of lead, and 60 mol % of iodine |

Example 1-1

Preparation of the Perovskite Film (1) A group of electrically conductive glass of fluorine-doped tin dioxide (FTO, with a fluorine doping amount of 10%, based on the weight of the tin dioxide) with a specification of 1.5 cm*1.5 cm*2.2 mm are taken, and part of each FTO is etched with a laser marking machine (the unetched area is a square area that starts from the center of the 1.5 cm*1.5 cm surface of the FTO and extends 0.5 cm to each of the four sides); the etched FTO electrically conductive glass piece is successively washed with acetone and iso-propyl alcohol several times, and finally immersed into deionized water for sonication for 10 min, until the glass surface is free of foreign objects and dirts, and the resulting material is dried and used as a substrate.

(2) The substrate obtained in step (1) is subject to a sputtering treatment with a target material 1 in magnetron sputtering equipment. A radio frequency power supply is used with a power of 3 kW, the pressure in the chamber of the magnetron sputtering equipment is 0.3 Pa, the process gas is argon, the flow rate of the argon is 500 sccm, the film coating time (i.e., the time for the sputtering treatment) is 10 min, and the thickness of the resulting film is 200 nm.

(3) The film layer obtained in step (2) is transferred into a 100 ml solution of iodoformamidine in iso-propyl alcohol for a chemical bath treatment, the solution has a concentration of 60 mg/ml, the bath treatment is performed at a temperature of 50° C., for a time of 20 min, followed by drying to remove the solvent.

(4) The film layer obtained in step (3) is subjected to a sputtering treatment in magnetron sputtering equipment. The tin metal is used as the target material, and the process gas is a mixed gas of argon:iodine vapor:bromine vapor at a volume ratio of 20:1:1, and in the process gas, the flow rate of the argon is 200 sccm, and those of the iodine vapor and the bromine vapor are both 10 sccm. A radio frequency power supply is used with a power of 2 kw, the temperature in the chamber of the magnetron sputtering equipment is 100° C. and the chamber pressure is 0.3 Pa, and the film coating time (i.e., the time for the sputtering treatment) is 40 min. The film thickness is increased by 150 nm after the sputtering treatment in this step.

By the above steps, the perovskite film of the present application can be obtained.

Preparation of the Perovskite Solar Cell (1) A group of electrically conductive glasses of fluorine-doped tin dioxide (FTO, with a fluorine doping amount of 10%, based on the weight of the tin dioxide) with a specification of 1.5 cm*1.5 cm*2.2 mm are taken, and part of each FTO is etched with a laser marking machine (the unetched area is a square area that starts from the center of the FTO and extends 0.5 cm to each of the four sides); the etched FTO electrically conductive glass piece is successively washed with acetone and iso-propyl alcohol several times, and finally immersed into deionized water for sonication for 10 min, until the glass surface is free of foreign objects and dirts, and the resulting material is used as a substrate.

(2) The FTO electrically conductive glass piece obtained in step (1) is dried in a blast drying oven to remove the moisture, and then transferred to the magnetron sputtering equipment for nickel oxide sputtering; wherein a radio frequency power supply is used with a power of 1.5 kW, the temperature in the chamber of the magnetron sputtering equipment is 50° C. and the chamber pressure is 0.2 Pa, the flow rate of the argon is 300 sccm and that of the oxygen is 50 sccm, the film coating time is 5 min, and the resulting film layer has a thickness of 30 nm.

(3) The resulting FTO electrically conductive glass with nickel oxide sputtering in step (2) is used as the substrate, and the perovskite film of the present application is prepared on the substrate; the preparation process is the same as that of the aforementioned perovskite film.

(4) The resulting piece with the perovskite film obtained by sputtering in step (3) is placed into a vacuum coating machine. Then 20 g of C60 (Fullerene C60) and 20 g of a BCP powder (2,9-dimethyl-4,7-biphenyl-1,10-phenanthroline) are respectively placed into the magnetron sputtering equipment, the C60 is first evaporated at 0.05 Å/s until a thickness of 5 nm, and then at 0.1 Å/s until a thickness of 30 nm. Then the BCP powder is evaporated, at Å/s until a thickness of 2 nm, and then at 0.1 Å/s until a thickness of 8 nm.

(5) The piece obtained in step (4) is placed into an evaporation coating machine, and have a layer of Ag electrode evaporated, wherein the Ag electrode has a thickness of 50 nm.

By the above steps, the perovskite solar cell of the present application can be obtained.

Measuring Method for Related Parameters

Band Gap Tests of Perovskite Films

The UV-3600 spectrophotometer from Shimadzu, Japan, is used, to measure the transmittance and absorption spectrum of the film. A 5 cm*5 cm*2.2 mm of white glass coated with a layer of perovskite film is selected and placed on the testing window, a setting of 300-1100 nm of transmittance and absorption is selected in the software, and then the test is performed to obtain the transmittance and absorption spectrum of the perovskite film layer. The band gap value of the perovskite film can be obtained by converting the Tauc curve and then taking the intersection of a tangent and the energy axis.

Efficiency Tests of Perovskite Solar Cells

According to the standard IEC61215: 2016 efficiency test methods, the efficiency of the components is tested using the IVS-KA6000 from Guangyan Technology Co., Ltd.

Examples 1-2 to 1-5

Except that in the process of preparing the perovskite film, the concentration of the solution of iodoformamidine in iso-propyl alcohol is 10 mg/ml, 20 mg/ml, 70 mg/ml and 100 mg/ml respectively, other conditions of Examples 1-2 to 1-5 are the same as those of Example 1-1.

Examples 1-6 to 1-9

Except that in the process of preparing the perovskite film, the temperature for the chemical bath treatment is 40° C., 80° C., 100° C. and 120° C. respectively, other conditions of Examples 1-6 to 1-9 are the same as those of Example 1-1.

Comparative Example 1

Except that in the process of preparing the perovskite film, the concentration of the solution of iodoformamidine in iso-propyl alcohol is 5 mg/ml, other conditions of Comparative example 1 are the same as those of Example 1-1.

Comparative Examples 2-3

Except that in the process of preparing the perovskite film, the temperature for the chemical bath treatment is 150° C. and 170° C. respectively, other conditions of Comparative examples 2-3 are the same as those of Example 1-1.

Comparative Example 4

Except that in the process of preparing the perovskite film, the chemical bath treatment is not performed, other conditions of Comparative example 4 are the same as those of Example 1-1.

TABLE 1

Test results of Examples 1-1 to 1-9 and Comparative Examples 1-4

| | Concentration of solution (mg/ml) | Temperature for chemical bath treatment (° C.) | Band gap (eV) | Efficiency |
|---|---|---|---|---|
| Example 1-1 | 60 | 50 | 1.42 | 18.9% |
| Example 1-2 | 10 | 50 | 1.41 | 10.7% |
| Example 1-3 | 20 | 50 | 1.40 | 12.1% |
| Example 1-4 | 70 | 50 | 1.39 | 17.3% |
| Example 1-5 | 100 | 50 | 1.41 | 14.9% |
| Example 1-6 | 60 | 40 | 1.42 | 15.6% |
| Example 1-7 | 60 | 80 | 1.43 | 15.6% |
| Example 1-8 | 60 | 100 | 1.45 | 14.7% |
| Example 1-9 | 60 | 120 | 1.42 | 10.6% |
| Comparative example 1 | 5 | 50 | 1.43 | 6.21% |
| Comparative example 2 | 60 | 150 | 1.42 | 5.23% |
| Comparative example 3 | 60 | 170 | 1.41 | 0% |
| Comparative example 4 | — | — | 1.44 | 7.21% |

It can be seen from Table 1 that, the resulting perovskite film is treated with the chemical bath, such that the conversion efficiency of the solar cell can be effectively improved. However, when the concentration of the solution of AX is too low or the temperature for the chemical bath treatment is too high, adding the step of chemical bath treatment may instead worsen the performance of the perovskite film, resulting in a decrease in the conversion efficiency of solar cells.

Examples 2-1 to 2-5

Except that in the process of preparing the perovskite film, the volume ratio of argon:iodine vapor:bromine vapor during the post-treatment process of step (4) is 20:1:1, 10:1:1, 20:0.5:0.5, 20:1.5:0.5, 10:0:1, respectively, other conditions of Examples 2-1 to 2-5 are the same as those of Example 1-1.

Comparative Examples 5-6

Except that in the process of preparing the perovskite film, the volume ratio of argon:iodine vapor:bromine vapor during the post-treatment process of step (4) is 0:0:0 and 1:0:0, respectively, other conditions of Comparative examples 5-6 are the same as those of Example 1-1.

TABLE 2

Test results of Examples 2-1 to 2-5 and Comparative Examples 5-6

| | Argon:iodine vapor:bromine vapor | Band gap (eV) | Efficiency |
|---|---|---|---|
| Example 2-1 | 20:1:1 | 1.42 | 18.9% |
| Example 2-2 | 10:1:1 | 1.50 | 16.3% |
| Example 2-3 | 20:0.5:1.5 | 1.47 | 17.9% |
| Example 2-4 | 20:1.5:0.5 | 1.42 | 17.0% |
| Example 2-5 | 10:0:1 | 1.40 | 15.3% |
| Comparative example 5 | 0:0:0 | 1.34 | 13.5% |
| Comparative example 6 | 1:0:0 | 1.21 | 10.6% |

The numerical values are the volume ratio of the various gases, and the total flow rate of the mixed gas is 220 sccm.

It can be seen from Table 2 that, in the process of the post-treatment of step (4), when argon and the halogen gas are present simultaneously, the performance of the perovskite film can be effectively improved, thus improving the efficiency of the solar cell. In particular, when the volume ratio of the argon to the halogen gas is 10:1 to 5:1, the conversion efficiency of the solar cell can be further improved.

Examples 3-1 to 3-4

Except that in the process of preparing the perovskite film, the sputtering temperature during the post-treatment of step (4) is 50° C., 150° C., 200° C. and 250° C. respectively, other conditions of Examples 3-1 to 3-4 are the same as those of Example 1-1.

Comparative Examples 7-8

Except that in the process of preparing the perovskite film, the sputtering temperature during the post-treatment of step (4) is 30° C. and 300° C. respectively, other conditions of Comparative examples 7-8 are the same as those of Example 1-1.

TABLE 3

Test results of Examples 3-1 to 3-4 and Comparative Examples 7-8

|  | [1]Sputtering temperature (° C.) | Band gap (eV) | Efficiency |
|---|---|---|---|
| Example 3-1 | 50 | 1.31 | 10.6% |
| Example 3-2 | 150 | 1.26 | 17.4% |
| Example 3-3 | 200 | 1.28 | 16.3% |
| Example 3-4 | 250 | 1.27 | 15.6% |
| Comparative example 7 | 30 | 1.27 | 8.21% |
| Comparative example 8 | 300 | 1.29 | 5.32% |

Note [1]refers to the sputtering temperature during the post-treatment, i.e., the step (4).

It can be seen from Table 3 that, in the process of the post-treatment of step (4), when the sputtering temperature is 50° C.-250° C., it is beneficial for improving the performance of the perovskite film, such that the efficiency of the solar cell can be improved. In particular, when the sputtering temperature is 100° C.-200° C., the improvement in the efficiency of the solar cell is more obvious.

It should be noted that the present application is not limited to the above embodiments. The above embodiments are exemplary only, and any embodiment that has substantially same constitutions as the technical ideas and has the same effects within the scope of the technical solution of the present application falls within the technical scope of the present application. In addition, without departing from the gist of the present application, various modifications that can be conceived by those skilled in the art to the embodiments, and other modes constructed by combining some of the constituent elements of the embodiments also fall within the scope of the present application.

The invention claimed is:

1. A method for preparing a perovskite film, including steps of
   (1) providing a target material comprising following elements: lead, a halogen, and one or more alkali metals;
   (2) sputtering using the target material in step (1) with a process gas, where the process gas is a noble gas so as to obtain a film;
   (3) subjecting the film obtained in step (2) to a chemical bath treatment using a chemical bath, wherein the chemical bath is a solution of AX, A is selected from one or more of formamidine or methylamine, and X is a halogen; and
   (4) sputtering on the film obtained in step (3) using a tin metal with another process gas, where the another process gas comprises a noble gas so as to obtain the perovskite film.

2. The method according to claim 1, wherein the target material in step (1) comprises 10-40% of an alkali metal, 10-40% of lead and 50-90% of the halogen, with a total of 100%, based on the total moles of the various elements in the target material.

3. The method according to claim 1, wherein in step (1), the halogen is one or more of chlorine, bromine or iodine, and the one or more alkali metals comprise one or more of potassium, rubidium or cesium.

4. The method according to claim 1, wherein the solution of AX in step (3) has a concentration of 10-100 mg/ml.

5. The method according to claim 1, wherein the chemical bath treatment in step (3) is carried out at a temperature of 40° C.-120° C.

6. The method according to claim 1, wherein the another process gas in step (4) comprises a halogen gas and a volume ratio of the noble gas to the halogen gas in step (4) is 10:1 to 5:1.

7. The method according to claim 1, wherein the another process gas in step (4) comprises a halogen gas and the halogen gas in step (4) includes one or more of iodine vapor, bromine vapor or chlorine vapor.

8. The method according to claim 1, wherein the step (4) is carried out at a temperature of 50° C.-250° C.

* * * * *